US011428584B2

(12) United States Patent
Suzuki

(10) Patent No.: US 11,428,584 B2
(45) Date of Patent: Aug. 30, 2022

(54) TEMPERATURE SENSOR, SENSOR ELEMENT AND MANUFACTURING METHOD OF TEMPERATURE SENSOR

(71) Applicant: SHIBAURA ELECTRONICS CO., LTD., Saitama (JP)

(72) Inventor: Tatsuyuki Suzuki, Saitama (JP)

(73) Assignee: SHIBAURA ELECTRONICS CO., LTD., Saitams (JP)

( * ) Notice: Subject to any disclaimer, the term of this patent is extended or adjusted under 35 U.S.C. 154(b) by 1009 days.

(21) Appl. No.: 16/088,724

(22) PCT Filed: Feb. 13, 2018

(86) PCT No.: PCT/JP2018/004838
§ 371 (c)(1),
(2) Date: Sep. 26, 2018

(87) PCT Pub. No.: WO2019/159221
PCT Pub. Date: Aug. 22, 2019

(65) Prior Publication Data
US 2021/0215549 A1 Jul. 15, 2021

(51) Int. Cl.
*G01K 1/12* (2006.01)
*G01K 1/16* (2006.01)
(Continued)

(52) U.S. Cl.
CPC ............... *G01K 7/22* (2013.01); *B05D 1/18* (2013.01); *B05D 7/20* (2013.01); *G01K 1/12* (2013.01); *G01K 1/16* (2013.01); *H05K 5/0247* (2013.01)

(58) Field of Classification Search
None
See application file for complete search history.

(56) References Cited

U.S. PATENT DOCUMENTS 6,437,679 B1 * 8/2002 Roques ............... G01K 7/22
29/612
2010/0052842 A1 3/2010 Kato et al.
(Continued)

FOREIGN PATENT DOCUMENTS

CN 101661818 A 3/2010
CN 105719782 A * 6/2016 ............ G01K 1/08
(Continued)

OTHER PUBLICATIONS

Modulus of Elasticity of 1740 Urethane Resin, 1730X Urethane Resin, and 1730 Urethane Resin (Year: 2022).*
(Continued)

*Primary Examiner* — Mirellys Jagan
(74) *Attorney, Agent, or Firm* — Pearne & Gordon LLP

(57) ABSTRACT

A temperature sensor includes a sensor element including a thermosensitive body, a protection tube accommodating the thermosensitive body part of the sensor element, and a filler filling a space between the protection tube and the sensor element inside the protection tube. The sensor element includes a first covering layer made of a first electrical insulator, the first covering layer covering the thermosensitive body, and a second covering layer made of a second electrical insulator, the second covering layer covering the first covering layer. The first covering layer has elastic modulus smaller than elastic modulus of the second covering layer.

16 Claims, 6 Drawing Sheets

(51) Int. Cl.
  *G01K 7/22*   (2006.01)
  *B05D 1/18*   (2006.01)
  *B05D 7/20*   (2006.01)
  *H05K 5/02*   (2006.01)

(56) References Cited

U.S. PATENT DOCUMENTS

| | | | |
|---|---|---|---|
| 2012/0026659 | A1 | 2/2012 | Kim et al. |
| 2013/0208765 | A1 | 8/2013 | Takahashi et al. |
| 2019/0187002 | A1 | 6/2019 | Baba |

FOREIGN PATENT DOCUMENTS

| | | | | |
|---|---|---|---|---|
| CN | 107209067 | A | | 9/2017 |
| EP | 0965826 | A1 | | 12/1999 |
| JP | S58-163838 | U | | 10/1983 |
| JP | S58-195847 | U | | 12/1983 |
| JP | S63-46701 | A | | 2/1988 |
| JP | H04180202 | A | | 6/1992 |
| JP | H05-75629 | U | | 10/1993 |
| JP | H05-92667 | U | | 12/1993 |
| JP | H06-65840 | U | | 9/1994 |
| JP | 3055727 | U | | 10/1998 |
| JP | 2003-139621 | A | | 5/2003 |
| JP | 2012-042238 | A | | 3/2012 |
| JP | 2014-016158 | A | | 1/2014 |
| KR | 20010029618 | A | * | 4/2001 ............... G01K 1/14 |
| WO | 2018003497 | A1 | | 1/2018 |
| WO | WO-2018003497 | A1 | * | 1/2018 ............... G01K 1/08 |

OTHER PUBLICATIONS

Young's Modulus of Butadiene Rubber (Year: 2022).*
Flexural Modulus of Epoxy Resin (Year: 2022).*
Modulus of Elasticity of Silicone Rubber (Year: 2022).*
Translation of JPS6346701A (Year: 1988).*
Translation of JPH0592667U (Year: 1993).*
International Search Report for International Application No. PCT/JP2018/004838, dated May 1, 2018.
Supplementary Partial European Search Report for application No. EP 18773922 dated Oct. 21, 2019.
Office action dated Apr. 2, 2021 for Chinese application No. 201880001609.7.
Supplementary Partial European Search Report for application No. EP 18773922.2 dated Jun. 13, 2019.

* cited by examiner

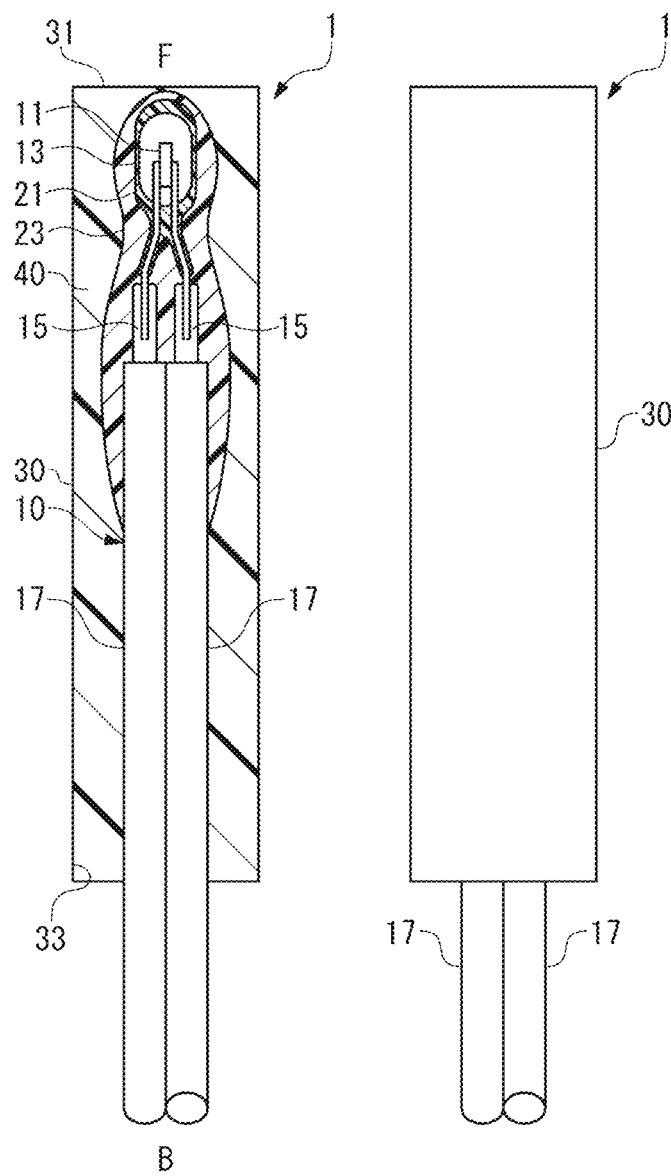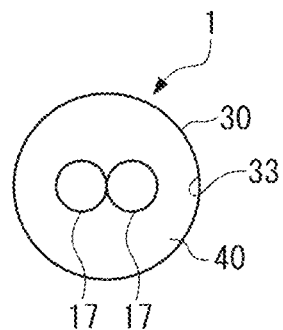

TEMPERATURE SENSOR, SENSOR ELEMENT AND MANUFACTURING METHOD OF TEMPERATURE SENSOR

This is the National Stage of PCT international application PCT/JP2018/004838 filed on Feb. 13, 2018, which is incorporated herein by reference in its entirety.

TECHNICAL FIELD

The present invention relates to a temperature sensor in which components of the temperature sensor are accommodated inside a protection tube and a space between the protection tube and an element is filled with a resin material.

BACKGROUND ART

As disclosed in Patent Literatures 1 to 5, there have been known temperature sensors in which a sensor element that includes a thermosensitive body is disposed inside a cylindrical case, and a filler made of a resin material is provided inside the case to hold the sensor element. The cylindrical case is closed at one end and open at the other end.

In these temperature sensors, the case contains a metal material excellent in thermal conductivity more than the filler in order to rapidly transfer ambient temperature to the thermosensitive body. In addition, the filler inside the case surrounds the sensor element to protect the sensor element from peripheral atmosphere. The case also protects the sensor element from peripheral atmosphere.

For example, Patent Literature 1 proposes a temperature sensor that prevents moisture from entering a gap between the metal case and the filler that is caused by thermal expansion difference.

Further, Patent Literature 5 proposes that a connection part between wiring and a lead wire is held by a holder made of an insulation material inside the case, to reliably insulate the connection part between the wiring and the lead wire from a protection tube.

CITATION LIST

Patent Literature

Patent Literature 1: JP H6-65840 U
Patent Literature 2: JP 3055727 U
Patent Literature 3: JP S58-163838 U
Patent Literature 4: JP 2003-139621 A
Patent Literature 5: JP 2012-42238 A

SUMMARY OF INVENTION

Technical Problem

In a temperature sensor used in wet atmosphere containing an extremely large amount of moisture, moisture enters inside of the temperature sensor even from a very small gap. When the moisture reaches a pair of conductive wires connected to the thermosensitive body, the moisture causes electrical short circuit. The temperature sensor repeatedly receives temperature rising and lowering. Therefore, when the conductive wires and members around the conductive wires are repeatedly expanded and contracted, a gap easily occurs around the conductive wires. This increases possibility that the moisture reaches the conductive wires in the wet atmosphere.

Accordingly, an object of the present invention is to provide a temperature sensor that makes it possible to prevent occurrence of the gap around the conductive wires or to suppress the gap to very small size even if it occurs, thereby preventing short circuit even when the temperature sensor is used in wet atmosphere.

Solution to Problem

A temperature sensor according to the present invention includes a sensor element including a thermosensitive body and a pair of conductive wires electrically connected to the thermosensitive body, a protection tube accommodating the sensor element, and a filler filling a space between the protection tube and the sensor element inside the protection tube.

The sensor element according to the present invention includes a first covering layer made of a first electrical insulator, the first covering layer covering from the thermosensitive body to predetermined positions of the pair of conductive wires, and a second covering layer made of a second electrical insulator, the second covering layer covering the first covering layer. The first covering layer has elastic modulus smaller than elastic modulus of the second covering layer.

The pair of conductive wires according to the present invention may include first regions that are connected to the thermosensitive body and include a small mutual distance, second regions that are respectively connected to the first regions and include a mutual distance continuously expanded, and third regions that are respectively connected to the second regions and include a mutual distance larger than the mutual distance of the first regions. In a case where conductors are exposed in all of the first regions, the second regions, and the third regions, the first covering layer preferably covers the pair of conductive wires independently in the second regions.

The second covering layer according to the present invention preferably covers from the first covering layer covering the thermosensitive body to predetermined positions at which insulation coverings of the pair of conductive wires are provided.

The filler according to the present invention is preferably joined to both of the second covering layer as well as the pair of conductive wires and the protection tube by bonding.

In the sensor element according to the present invention, a glass protection layer (13) is preferably provided around the thermosensitive body.

In the sensor element according to the present invention, the first covering layer is preferably made of silicone rubber, and the second covering layer is preferably made of an epoxy resin.

In addition, the filler according to the present invention is preferably made of the epoxy resin.

The filler is preferably made of the epoxy resin having higher thermal conductivity than the second covering layer.

The present invention provides a sensor element that includes a thermosensitive body, a pair of conductive wires electrically connected to the thermosensitive body, and a first covering layer made of a first electrical insulator, the first covering layer covering the thermosensitive body.

In the sensor element, the pair of conductive wires include first regions that are connected to the thermosensitive body and include a small mutual distance, second regions that are respectively connected to the first regions and include a mutual distance continuously expanded, and third regions that are respectively connected to the second regions and include a mutual distance larger than the mutual distance of the first regions. Conductors are exposed in all of the first regions, the second regions, and the third regions.

In the sensor element according to the present invention, the first covering layer covers the pair of conductive wires independently in the second regions.

The sensor element according to the present invention preferably further includes a second covering layer made of an electrical insulator, the second covering layer covering the first covering layer, and the first covering layer preferably has elastic modulus smaller than elastic modulus of the second covering layer.

Further, in the sensor element according to the present invention, a glass protection layer is preferably interposed between the thermosensitive body and the first covering layer.

The present invention proposes a manufacturing method of a temperature sensor that includes a sensor element including a thermosensitive body and a pair of conductive wires electrically connected to the thermosensitive body, a protection tube accommodating the thermosensitive body part of the sensor element, and a filler filling a space between the protection tube and the sensor element inside the protection tube.

The manufacturing method of the temperature sensor according to the present invention includes a step (a) of forming, by dipping, a first covering layer made of a first electrical insulator, the first covering layer covering from the thermosensitive body to predetermined positions of the pair of conductive wires, a step (b) of forming, by dipping, a second covering layer made of a second electrical insulator, the second covering layer covering the first covering layer, and a step (c) of inserting the sensor element, from side formed with the second covering layer, into the protection tube in which the filler in an unsolidified state is accommodated.

In the temperature sensor thus obtained, the first covering layer has elastic modulus smaller than elastic modulus of the second covering layer.

Advantageous Effects of Invention

In the temperature sensor according to the present invention, the first covering layer covering the thermosensitive body has the elastic modulus smaller than the elastic modulus of the second covering layer. Accordingly, even if the temperature sensor repeatedly receives temperature rising and lowering and the components of the temperature sensor are expanded or contracted, the first covering layer easily elastically deforms to function as a buffer with respect to expansion and contraction. As a result, it is possible to prevent occurrence of a gap around the conductive wires or to suppress the gap to very small size even if it occurs, thereby preventing short circuit even when the temperature sensor is used in atmosphere.

Further, in the temperature sensor, the first covering layer is covered with the second covering layer that has the elastic modulus larger than the elastic modulus of the first covering layer. This makes it possible to reliably achieve electrical insulation for the sensor element.

BRIEF DESCRIPTION OF DRAWINGS

FIGS. 1A to 1C each illustrate a temperature sensor according to an embodiment of the present invention, FIG. 1A being a partial longitudinal sectional view, FIG. 1B being a side view, and FIG. 1C being a front view.

DESCRIPTION OF EMBODIMENT

Figure 2:
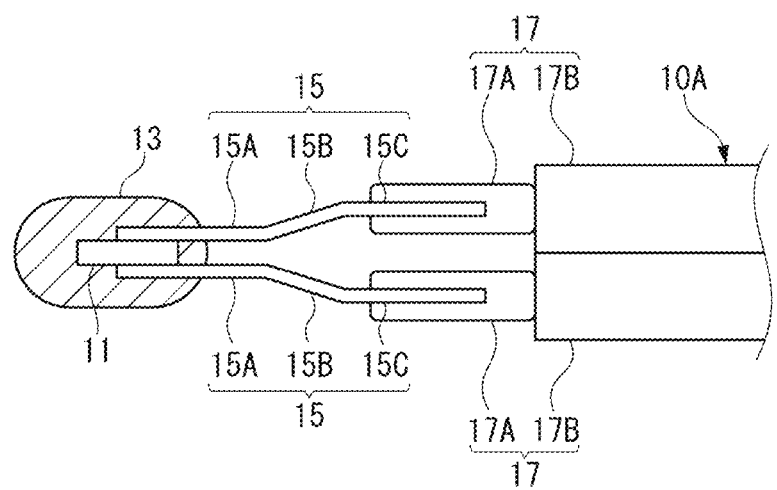
FIG. 2 is a fragmentary longitudinal sectional view illustrating a first intermediate body of FIG. 5A.

A temperature sensor 1 according to a preferred embodiment of the present invention is described below with reference to drawings.

As illustrated in FIG. 1, the temperature sensor 1 includes a sensor element 10 as a main device for temperature detection, a protection tube 30 that covers a main part of the sensor element 10, and a filler 40 that fills a space between the sensor element 10 and the protection tube 30.

The temperature sensor 1 includes a configuration suppressing occurrence of a gap around extraction wires 15 and 15 of the sensor element 10 even when ambient temperature is repeatedly raised and lowered. This makes it possible to suppress occurrence of short circuit between the extraction wires 15 and 15 of the sensor element 10 even when the temperature sensor 1 is used in wet environment.

In the following, components of the temperature sensor 1 are described, and a manufacturing procedure of the temperature sensor 1 is then described.

<Sensor Element 10>

Figure 3A:
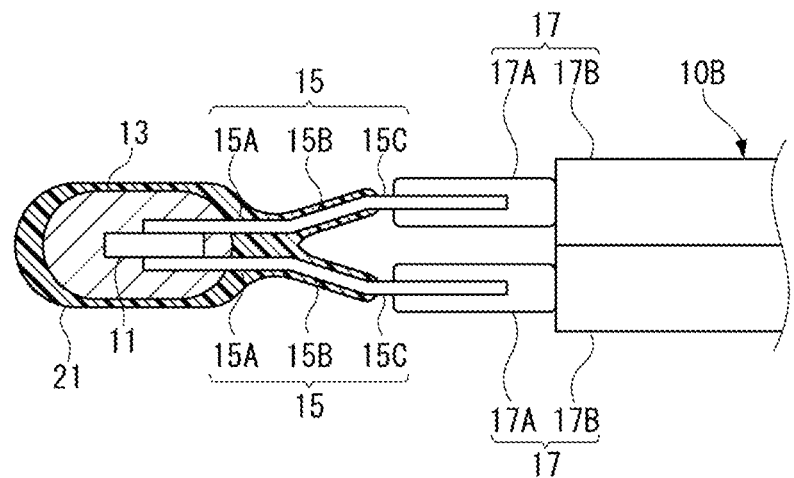
FIGS. 3A and 3B each illustrate a second intermediate body of FIG. 5B, FIG. 3A being a partial longitudinal sectional view, and FIG. 3B being a side view.

As illustrated in FIG. 1A and FIG. 3A, the sensor element 10 includes a thermosensitive body 11, a glass protection layer 13 that covers surroundings of the thermosensitive body 11, a pair of extraction wires 15 and 15 that are electrically connected to the thermosensitive body 11, and lead wires 17 and 17 that are respectively connected to the extraction wires 15 and 15. The extraction wires 15 and 15 and the lead wires 17 and 17 that are respectively electrically connected to each other constitute a pair of conductive wires according to the present invention.

Note that, in the temperature sensor 1, side on which the thermosensitive body 11 is provided is defined as front F, and side on which the lead wires 17 are drawn out is defined as rear B, as illustrated in FIG. 1A. The definitions are relative to each other.

[Thermosensitive Body 11]

As the thermosensitive body 11, for example, a thermistor is preferably used. The thermistor is an abbreviation for a thermally sensitive resistor, and is a metal oxide that uses change of electrical resistance according to temperature, to measure the temperature.

The thermistor is classified into an NTC (negative temperature coefficient) thermistor and a PTC (positive temperature coefficient) thermistor, and any of the thermistors is usable in the present invention.

As the NTC thermistor, an oxide sintered compact that includes, as a basic composition, a manganese oxide ($Mn_3O_4$) including a typical spinel structure is usable for the thermosensitive body 11. The oxide sintered compact that includes a composition of $M_xMn_3\text{-}xO_4$ in which M element (one or two or more kinds of Ni, Co, Fe, Cu, Al, and Cr) is added to the basic composition, is usable for the thermosensitive body 11. Further, one or two or more kinds of V, B, Ba, Bi, Ca, La, Sb, Sr, Ti, and Zr may be added thereto.

In addition, as the PTC thermistor, an oxide sintered compact that includes, as a basic composition, a composite oxide including a typical perovskite structure, such as $YCrO_3$, is usable for the thermosensitive body 11.

[Protection Layer 13]

As illustrated in FIG. 1A and FIG. 2, the glass protection layer 13 seals the thermosensitive body 11 to hold the thermosensitive body 11 in an air-tight state, thereby preventing occurrence of chemical and physical change of the thermosensitive body 11 based on an environmental condition, and mechanically protecting the thermosensitive body 11 as well. The glass protection layer 13 covers, in addition to the whole of the thermosensitive body 11, front ends of the respective extraction wires 15 and 15 to seal the extraction wires 15 and 15.

Note that providing of the glass protection layer 13 is merely a preferred embodiment in the present invention, and providing of the protection layer 13 is optional.

[Extraction Wire 15]

The extraction wires 15 and 15 are electrically connected to unillustrated electrodes of the thermosensitive body 11.

As each of the extraction wires 15 and 15, a Dumet wire that has a linear expansion coefficient similar to that of glass is used because the extraction wires 15 and 15 are sealed by the protection layer 13. Note that the Dumet wire is a conductive wire in which an alloy mainly containing iron and nickel is used as a conductor (core wire) and the conductor is covered with copper. The conductors of the respective extraction wires 15 and 15 are exposed. Therefore, if moisture enters, short circuit may occur. Linear expansion coefficients of the respective components of the temperature sensor 1 are described below.

Linear Expansion Coefficient
Silicone rubber: 2.0 to $4.0 \times 10^{-4}$ (/° C.)
Epoxy resin: 5.0 to $8.0 \times 10^{-3}$ (/° C.)
Copper: 16.5 to $16.8 \times 10^{-6}$ (/° C.)
Dumet wire: 4.5 to $6.0 \times 10^{-7}$ (/° C.)
Glass: $91 \times 10^{-7}$ (/° C.)

As illustrated in FIG. 2, the extraction wires 15 and 15 include first regions 15A that are connected to the thermosensitive body 11 on the front side and include a narrow distance therebetween, and third regions 15C that are respectively connected to the lead wires 17 and 17 on the rear side and include a wide distance therebetween. The distance on the front side is specified by dimensions of the thermosensitive body 11, and the distance on the rear side is specified by a distance between the lead wires 17 and 17.

To match the distance between the first regions 15A and the distance between the third regions 15C, the extraction wires 15 and 15 include, between the first regions 15A and the third regions 15C, second regions 15B that include a distance continuously expanded.

[Lead Wire 17]

The lead wires 17 and 17 respectively include core wires 17A and 17A including conductors, and insulation coverings 17B and 17B that cover the core wires 17A and 17A. The lead wires 17 and 17 are electrically connected, at parts of the core wires 17A and 17A, to the extraction wires 15 and 15 by welding, a conductive adhesive, etc., respectively.

Each of the lead wires 17 is not restricted in linear expansion coefficient unlike the extraction wires 15, and an optional material is selectable for the lead wires 17 as long as the material includes predetermined thermal resistance and predetermined durability.

[First Covering Layer 21]

Figure 3B:
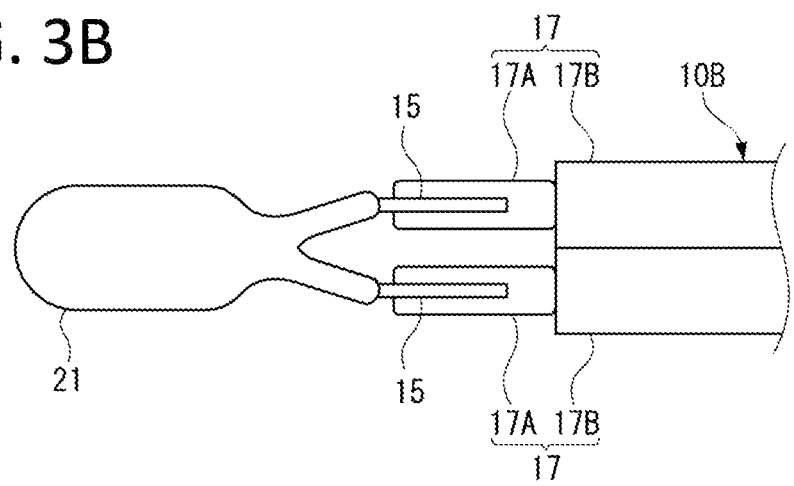

As illustrated in FIG. 1A, FIGS. 3A and 3B, the sensor element 10 includes a first covering layer 21 made of silicone rubber. The first covering layer 21 functions as an insulator for the protection layer 13 and the extraction wires 15, and ideally includes a dense film without a hole. The silicone rubber constitutes a first electrical insulator according to the present invention.

In this example, a second covering layer 23 made of an epoxy resin described later functions as an insulator, as with the first covering layer 21. The first covering layer 21 made of silicone rubber is provided because the silicone rubber includes high elasticity. In other words, a comparison between tensile elastic modulus of the silicone rubber and that of the epoxy resin may be described as follows, and the silicone rubber is much lower in elastic modulus than the epoxy resin, and easily deforms even by small force.

Tensile Elastic Modulus
Silicone rubber: 0.01 to 20 ($N/mm^2$)
Epoxy resin: 2000 to 5000 ($N/mm^2$)

When the temperature sensor 1 is used in an environment where there is a temperature difference, the components making up the temperature sensor 1, for example, the extraction wires 15 and 15 and the first covering layer 21 covering the extraction wires 15 and 15 are repeatedly expanded and contracted. The extraction wires 15 and 15 and the first covering layer 21 are considerably different in linear expansion coefficient from each other. If expansion and contraction are repeated, the extraction wires 15 and 15 and the first covering layer 21 may be separated from each other. The silicone rubber making up the first covering layer 21, however, easily deforms because of small elastic modulus as described below, which makes it possible to absorb expansion and contraction.

As described above, the first covering layer 21 made of silicone rubber has a buffer function to prevent separation of the extraction wires 15 and 15 and the first covering layer 21 caused by thermal stress associated with temperature rising and lowering, in addition to the function as the insulation covering layer.

As illustrated in FIGS. 3A and 3B, the first covering layer 21 covers a region from a front end of the protection layer 13 to predetermined positions of the respective extraction wires 15 on the front side. The thermosensitive body 11 and the protection layer 13 are wholly covered with the first covering layer 21. The first covering layer 21 is characterized in a shape of a part covering the extraction wires 15. In other words, the first covering layer 21 covers the first regions 15A and the second regions 15B of the extraction wires 15. In addition, the two extraction wires 15 are bundled and covered with the first covering layer 21 in the first regions 15A, whereas each of the extraction wires 15 is independently covered with the first covering layer 21 in the second regions 15B. As a result, the first covering layer 21 has a substantially V-shape between the pair of extraction wires 15 and 15, and a creepage distance between the pair of extraction wires 15 and 15 is long. The shape of the first covering layer 21 on the extraction wires 15 is a preferred shape in the present invention.

A thickness of the first covering layer 21 is optional as long as an intended purpose is achieved. As one rough indication, when the first covering layer 21 includes the thickness of 0.1 mm or more, the first covering layer 21 can achieve the function as the insulation film.

[Second Covering Layer 23]

Figure 4A:
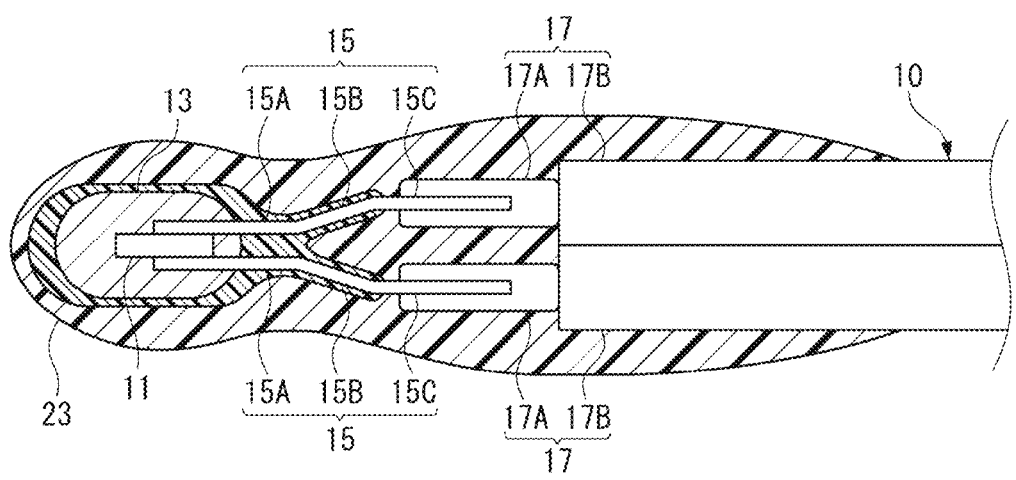
FIGS. 4A and 4B each illustrate a sensor element of FIG. 6, FIG. 4A being a partial longitudinal sectional view, and FIG. 4B being a side view.
Figure 4B:
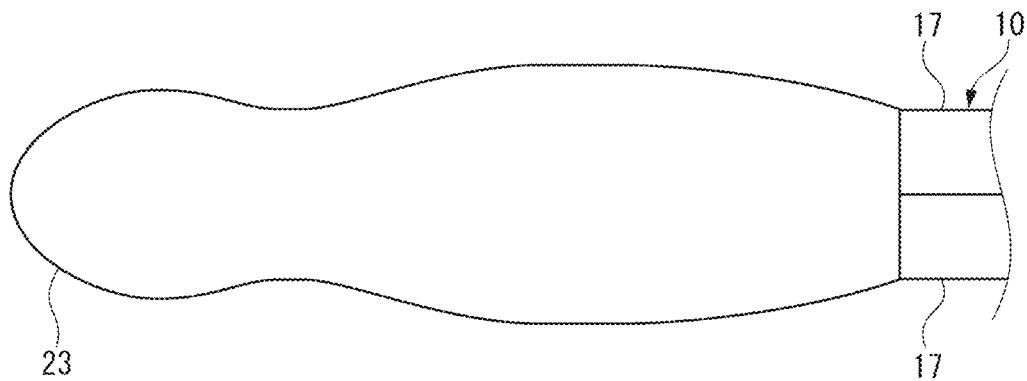

Next, as illustrated in FIG. 1A, FIGS. 4A and 4B, the sensor element 10 includes the second covering layer 23 made of an epoxy resin. The second covering layer 23 also functions as an insulator for the protection layer 13, the extraction wires 15, and the lead wires 17, as with the first covering layer 21. In addition, the second covering layer 23 has a function as a joining layer that is bonded to the filler 40 made of an epoxy resin. The epoxy resin making up the second covering layer 23 constitutes a second electrical insulator according to the present invention.

The second covering layer 23 covers a region from a front end of the first covering layer 21 to predetermined positions of the insulation coverings 17B and 17B of the lead wires 17 and 17, and the first covering layer 21 is wholly covered with the second covering layer 23.

In this case, the epoxy resin making up the second covering layer 23 is applied after the silicone rubber making up the first covering layer 21 is solidified. Accordingly, sufficient bond strength is not expected. Therefore, if the first covering layer 21 is brought into direct contact with the filler 40 without providing the second covering layer 23, a water entry passage is easily generated between the first covering layer 21 and the filler 40 because of insufficient bond strength therebetween. The second covering layer 23 is provided to solve such a problem.

In other words, since the second covering layer 23 covers the whole of the first covering layer 21, even when the bond strength between the silicone rubber and the epoxy resin is low, the water entry passage is hardly generated between the first covering layer 21 and the second covering layer 23. On the other hand, the bond strength between the epoxy resins is high, and the bond strength between the second covering layer 23 and the filler 40 is accordingly high. Therefore, the water entry passage is hardly generated therebetween.

Further, the silicone rubber making up the first covering layer 21 has the linear expansion coefficient larger by one digit than the linear expansion coefficient of the epoxy resin. Accordingly, in addition to the first covering layer 21, if both the second covering layer 23 and the filler 40 are also made of silicone rubber, thermal stress applied to the protection tube 30 is increased when expansion and contraction inside the protection tube 30 are repeated. Therefore, making up the second covering layer 23 and the filler 40 by the epoxy resin smaller in linear expansion coefficient than the silicone rubber makes it possible to suppress thermal stress applied to the protection tube 30.

On the other hand, consider that the first covering layer 21 is made of an epoxy resin having large elastic modulus. The linear expansion coefficient of the epoxy resin is little different from the linear expansion coefficient of the Dumet wire, as compared with the linear expansion coefficient of the silicone rubber; however, the elastic modulus of the epoxy resin is considerably larger than the elastic modulus of the silicone rubber. Accordingly, the epoxy resin is easily separated from the extraction wires 15 and 15 due to expansion and contraction associated with temperature rising and lowering.

A thickness of the second covering layer 23 is optional as long as an intended purpose is achieved. As one rough indication, when the second covering layer 23 includes the thickness of 0.3 mm or more, the second covering layer 23 can achieve the function as the insulation film.

[Protection Tube 30]

Next, as illustrated in FIGS. 1A to 1C, the protection tube 30 is made of a metal that covers from a front end of the sensor element 10 to the lead wires 17 and 17, typically, is made of copper or a copper alloy having high thermal conductivity. The protection tube 30 is made of a metal material having high thermal conductivity in order to protect the sensor element 10 accommodated inside the protection tube 30, from the ambient atmosphere, and to transfer temperature of the ambient atmosphere to the inside as well.

The protection tube 30 is a cylindrical member including one end that is closed as a closed end 31 and the other end that is an open end 33. The closed end 31 of the protection tube 30 is located on the front side and the open end 33 is located on the rear side, and the sensor element 10 is supported inside the protection tube 30 through the filler 40.

[Filler 40]

The filler 40 fills the space between the sensor element 10 and the protection tube 30 to support the sensor element 10 inside the protection tube 30.

The filler 40 is made of an epoxy resin, and is joined to the second covering layer 23 of the sensor element 10 with bond strength and is also joined to an inner wall of the protection tube 30 with bond strength. As a result, the water entry passage is hardly generated inside the protection tube 30.

The filler 40 and the second covering layer 23 is similar in that they are made of epoxy resin. As for the filler 40, however, a material having higher thermal conductivity than the second covering layer 23 is used in consideration of the fact that the filler 40 has a main purpose to transfer the ambient temperature toward the thermosensitive body 11. In contrast, as for the second covering layer 23, a material determined in consideration of the fact that dipping described later is properly performable is used.

<Manufacturing Procedure of Temperature Sensor 1>

Next, a manufacturing procedure of the temperature sensor 1 is described with reference to FIGS. 5A to 5D. [First Intermediate body]

Figure 5A:
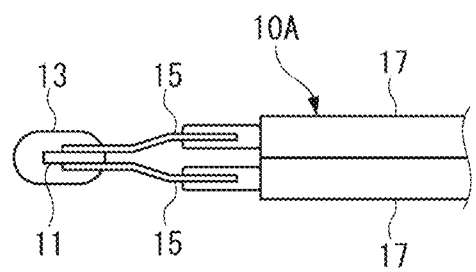
FIGS. 5A to 5D are diagrams illustrating a manufacturing procedure of the temperature sensor of FIGS. 1A to 1C, FIG. 5A illustrating the first intermediate body, FIG. 5B illustrating the second intermediate body provided with a covering made of silicone rubber, FIG. 5C illustrating a sensor element further provided with a covering made of an epoxy resin, and FIG. 5D illustrating the temperature sensor according to the present embodiment.

First, as illustrated in FIG. 5A, a first intermediate body 10A that does not include the first covering layer 21 and the second covering layer 23 is prepared. In the first intermediate body 10A, the extraction wires 15 and 15 are connected to a pair of electrodes (not illustrated) that are provided on respective front and rear surfaces of the thermosensitive body 11. Note that the lead wires 17 and 17 are already connected to the extraction wires 15 and 15, respectively. The protection layer 13 is formed by heating and melting a glass tube in a state where the thermosensitive body 11 connected to the extraction wires 15 and the like is disposed so as to penetrate through an inside of the glass tube.

[Second Intermediate Body]

Figure 5B:
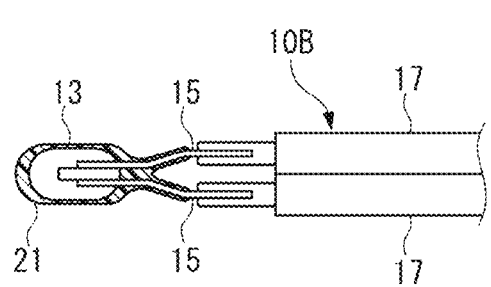

Next, as illustrated in FIG. 5B, the first covering layer 21 is formed on the first intermediate body 10A to obtain a second intermediate body 10B.

The first covering layer 21 is formed by dipping the thermosensitive body 11 (protection layer 13) side in liquid silicone rubber. At this time, parts covering the extraction wires 15 and 15 preferably independently cover the respective extraction wires 15 and 15. For example, predetermined control is performed when the sensor element 10 is dipped in the liquid silicon rubber and is then pulled up, to form the first covering layer 21 covering the extraction wires 15 and 15 independently.

[Third Intermediate Body]

Figure 5C:
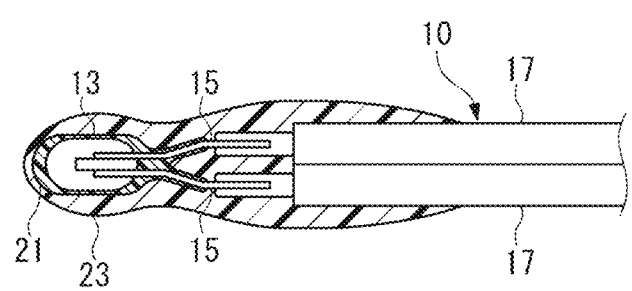
Figure 5D:
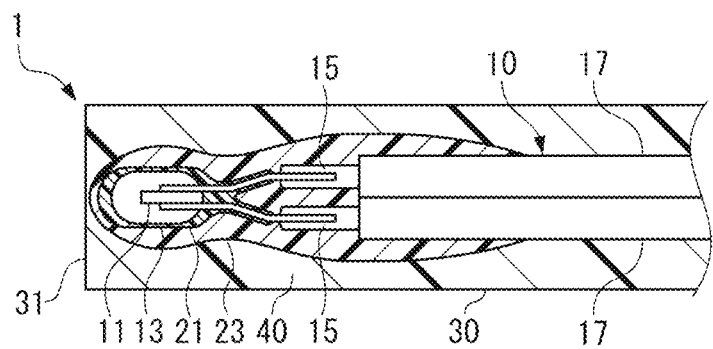

Next, as illustrated in FIG. 5C, the second covering layer 23 is formed on the second intermediate body to obtain the sensor element 10 as a third intermediate body.

The second covering layer 23 is formed by dipping, in a liquid epoxy resin, the thermosensitive body 11 (protection layer 13) side formed with the first covering layer 21, in a manner similar to the first covering layer 21.

[Sealing in Protection Tube 30]

Next, the sensor element 10 formed with the second covering layer 23 is sealed in the protection tube 30. The sealing is performed by the following procedure.

A predetermined amount of liquid epoxy resin that constitutes the filler 40 after solidification is thrown in the protection tube 30, the open end 33 of which is directed upward. The sensor element 10 is inserted, from the front end, into the protection tube 30 in which the epoxy resin has been thrown. After the epoxy resin is solidified, the temperature sensor 1 is completed.

[Effects of Temperature Sensor 1]

Effects achieved by the above-described temperature sensor 1 are described.

In the temperature sensor 1, the first covering layer 21 that covers the thermosensitive body 11 through the protection layer 13 is made of the silicone rubber that has small elastic modulus, namely, easily deforms when receiving external force. Accordingly, even when the temperature sensor 1 repeatedly receives temperature rising and lowering and the components of the temperature sensor 1 are expanded or contracted, the first covering layer 21 easily elastically deforms to function as a buffer with respect to expansion and contraction. As a result, it is possible to suppress occurrence of a gap associated with thermal expansion difference of the members making up the temperature sensor 1 while securing electrical insulation for the extraction wires 15 and 15.

Next, in the temperature sensor 1, the whole of the first covering layer 21 is covered with the second covering layer 23 made of an epoxy resin. This makes it possible to more reliably achieve electrical insulation for the sensor element 10, and to secure the bond strength with the filler 40 to secure support inside the protection tube 30 as well.

Figure 6:
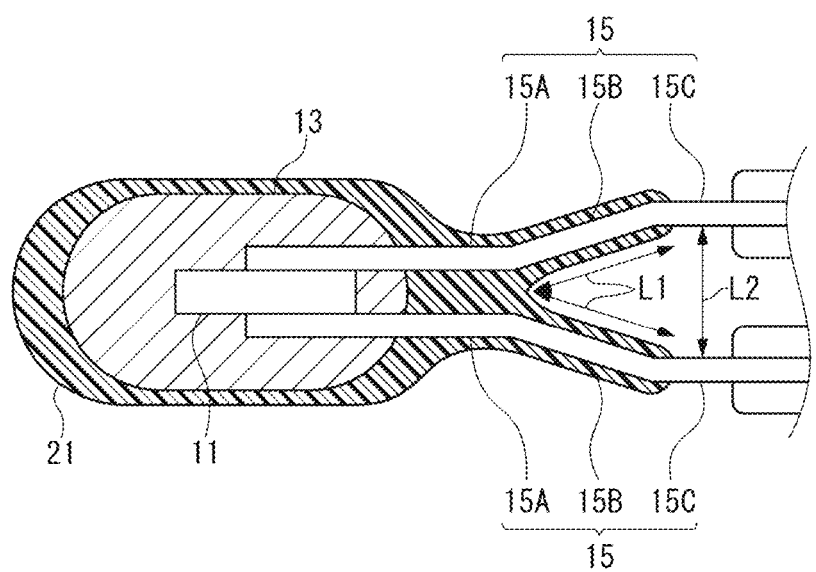
FIG. 6 is a diagram illustrating a creepage distance of the first intermediate body of FIG. 5B.

Next, in the temperature sensor 1, the first covering layer 21 covers the extraction wires 15 and 15 independently in the second regions 15B and 15B. Accordingly, the first covering layer 21 is not present between the extraction wires 15 and 15 in the second regions 15B and 15B, and the creepage distance between the extraction wires 15 and 15 in the third regions 15C and 15C becomes 2 ×L1, as illustrated in FIG. 6. In contrast, if the first covering layer 21 is formed so as to fill the space between the extraction wires 15 and 15 in the second regions 15B and 15B, the creepage distance between the extraction wires 15 and 15 in the third regions 15C and 15C becomes a distance L2.

It is easily found from comparison between the distance 2×L1 and the distance L2 that covering the extraction wires 15 and 15 independently considerably increases the creepage distance. Accordingly, the temperature sensor 1 makes it possible to suppress occurrence of short circuit between the extraction wires 15 and 15 even if water enters such a region.

Although the preferred embodiment of the present invention has been described above, the configurations described in the aforementioned embodiment may be selected or replaced with other configuration without departing from the scope of the present invention.

For example, the silicone rubber is used for the preferred first covering layer 21 in the present embodiment; however, the present invention is not limited thereto. For example, butadiene rubber may be used. The resin material is common with the silicon rubber in electrical insulation and water resistance, and in mechanical characteristic of small elastic modulus.

Further, the epoxy resin is used for the preferred second covering layer 23 in the present embodiment; however, the present invention is not limited thereto. A resin material including physical and chemical characteristics equivalent to those of the epoxy resin may be used.

Further, the example of the thermistor as the thermosensitive body has been described in the present embodiment; however, the present invention is not limited thereto. For example, an electrical resistor using platinum may be used as the thermosensitive body.

Further, the pair of extraction wires 15 and 15 are formed in a V-shape; however, the present invention is not limited thereto. The present invention widely encompasses a shape including a wide mutual gap, for example, a U-shape.

REFERENCE SIGNS LIST

1 Temperature sensor
10 Sensor element
11 Thermosensitive body
13 Protection layer
15 Extraction wire
15A First region
15B Second region
15C Third region
17 Lead wire
17A Core wire
17B Insulation covering
21 First covering layer
23 Second covering layer
30 Protection tube
31 Closed end
33 Open end
40 Filler

The invention claimed is:

1. A sensor element, comprising:
a thermosensitive body;
a pair of conductive wires electrically connected to the thermosensitive body; and
a first covering layer made of a first electrical insulator, the first covering layer covering the thermosensitive body,
wherein the pair of conductive wires include:
first regions that are connected to the thermosensitive body, the first regions being spaced apart by a first spatial distance,
second regions that are respectively connected to the first regions, the second regions being spaced apart by a second spatial distance that continuously expands, and
third regions that are respectively connected to the second regions, the third regions being spaced apart by a third spatial distance that is larger than the first spatial distance, and
wherein the first covering layer covers the pair of conductive wires independently in the second regions such that a first portion of the first covering layer covers the second region of one wire of the pair of conductive wires, and a second portion of the first covering layer covers the second region of the other wire of the pair of conductive wires, the first and second portions having a space therebetween that continuously expands such that a creepage distance between the third regions is greater than the third spatial distance between the third regions.

2. The sensor element according to claim 1, further comprising a second covering layer made of a second electrical insulator, the second covering layer covering the first covering layer, wherein
the first covering layer has an elastic modulus that is smaller than an elastic modulus of the second covering layer.

3. The sensor element according to claim 1, wherein a glass protection layer is interposed between the thermosensitive body and the first covering layer.

4. The sensor element according to claim 1, further comprising a second covering layer that covers the first covering layer, wherein a portion of the second covering layer is present in the space between the first portion and second portion of the first covering layer.

5. The sensor element according to claim 1, wherein the second regions of the pair of conductive wires are arranged between the first regions and third regions.

6. The sensor element according to claim 1, wherein each conductive wire comprises a conductor and an insulation covering that partially covers the conductor, wherein the insulation covering does not cover the conductor in the first region, the second region, and the third region of the conductive wire.

7. The sensor element according to claim 1, wherein the creepage distance between the third regions corresponds to the shortest distance along the first covering layer between the third regions.

8. A method of manufacturing the sensor element according to claim 1, the method comprising:
a step of providing an intermediate body having the thermosensitive body and pair of conductive wires electrically connected to the thermosensitive body; and
a step of dipping the intermediate body at least partially in a liquid material to form the first covering layer, the first covering layer covering from the thermosensitive body to predetermined positions of the pair of conductive wires,
wherein the method forms the sensor element.

9. A temperature sensor, comprising:
the sensor element according to claim 1;
a protection tube accommodating the sensor element; and
a filler filling a space between the protection tube and the sensor element inside the protection tube, wherein
the sensor element includes a second covering layer made of a second electrical insulator, the second covering layer covering the first covering layer, and
the first covering layer has an elastic modulus that is smaller than an elastic modulus of the second covering layer.

10. The temperature sensor according to claim 9, wherein the second covering layer covers from the first covering layer covering the thermosensitive body to predetermined positions at which insulation coverings of the pair of conductive wires are provided.

11. The temperature sensor according to claim 9, wherein the filler is joined to both of the second covering layer as well as the pair of conductive wires and the protection tube by bonding.

12. The temperature sensor according to claim 9, wherein a glass protection layer is provided around the thermosensitive body.

13. The temperature sensor according to claim 9, wherein
the first covering layer is made of silicone rubber, and
the second covering layer is made of an epoxy resin.

14. The temperature sensor according to claim 13, wherein the filler is made of another epoxy resin.

15. The temperature sensor according to claim 14, wherein the epoxy resin of the filler has a higher thermal conductivity than the epoxy resin of the second covering layer.

16. A method of manufacturing the temperature sensor according to claim 9, the method comprising:
a step of providing a first intermediate body having the thermosensitive body and pair of conductive wires electrically connected to the thermosensitive body;
a step of dipping the first intermediate body at least partially in a liquid material to form a second intermediate body having the thermosensitive body, the pair of conductive wires, and the first covering layer, the first covering layer covering from the thermosensitive body to predetermined positions of the pair of conductive wires;
a step of dipping the second intermediate body at least partially in another liquid material to form the sensor element having the thermosensitive body, the pair of conductive wires, the first covering layer, and the second covering layer; and
a step of inserting the sensor element, from a side formed with the second covering layer, into the protection tube in which the filler in an unsolidified state is accommodated, wherein the method forms the temperature sensor.

* * * * *

UNITED STATES PATENT AND TRADEMARK OFFICE
CERTIFICATE OF CORRECTION

PATENT NO. : 11,428,584 B2
APPLICATION NO. : 16/088724
DATED : August 30, 2022
INVENTOR(S) : Tatsuyuki Suzuki It is certified that error appears in the above-identified patent and that said Letters Patent is hereby corrected as shown below:

On the Title Page

(73) Assignee: "Saitams (JP)" should be --Saitama (JP)--

In the Specification

Column 8, Line 30, "Lead wire" should be --17 Lead wire--

Signed and Sealed this
Twenty-seventh Day of August, 2024

Katherine Kelly Vidal
*Director of the United States Patent and Trademark Office*